United States Patent [19]
Watts

[11] 4,225,825
[45] Sep. 30, 1980

[54] PRECISION SELF-ADJUSTING SLOPE CIRCUIT

[75] Inventor: Geoffrey P. Watts, Mesa, Ariz.

[73] Assignee: Beckman Instruments, Inc., Fullerton, Calif.

[21] Appl. No.: 945,159

[22] Filed: Sep. 25, 1978

Related U.S. Application Data

[63] Continuation of Ser. No. 758,116, Jan. 10, 1977, abandoned.

[51] Int. Cl.² .................. H03K 5/00; H03K 4/10
[52] U.S. Cl. .................. 328/185; 328/151; 328/127; 307/228
[58] Field of Search .............. 328/181, 185, 127, 116, 328/151; 307/271, 228

[56] References Cited

U.S. PATENT DOCUMENTS

| 3,439,282 | 5/1969 | Moriyasu | 328/185 |
| 3,577,007 | 5/1971 | Cross | 328/181 |
| 3,577,012 | 5/1971 | Dummeruth | 328/181 |

Primary Examiner—Stanley D. Miller, Jr.
Assistant Examiner—B. P. Davis
Attorney, Agent, or Firm—R. J. Steinmeyer; F. L. Mehlhoff

[57] ABSTRACT

An improved ramp generating circuit which is self-compensating for changes in component performance is disclosed. The circuit is designed to attain a reference voltage in a fixed number of counts as provided by a precision clock source. A single direction compensation feedback network is employed to increase the slope in increments until the desired peak level and clock count are attained simultaneously. Embodiments are shown wherein the circuit is employed in a gas discharge bar graph display driving circuit and as an analog-to-digital converter.

6 Claims, 5 Drawing Figures

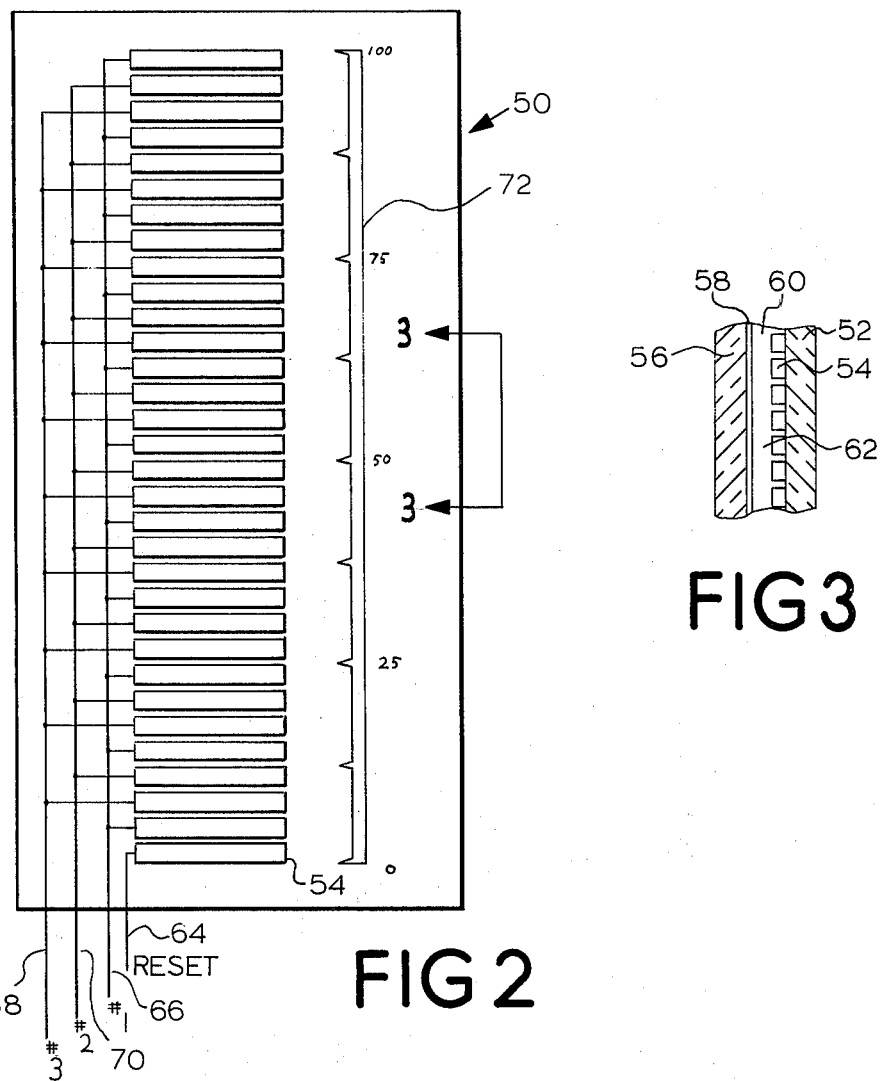
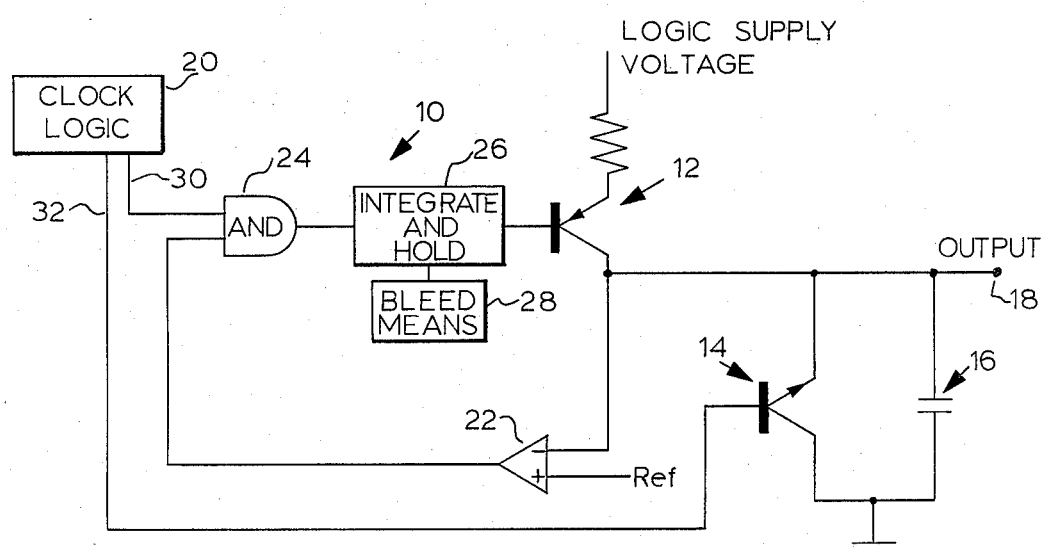

PRECISION SELF-ADJUSTING SLOPE CIRCUIT

This is a continuation of application Ser. No. 758,116, filed Jan. 10, 1977 now abandoned.

BACKGROUND OF THE INVENTION

The present invention relates to ramp generating circuits and more particularly to ramp generating circuits having compensation means to automatically adjust for operational variations in circuit components.

Circuits for generating ramp function outputs are well known in the art. Likewise, ramp function generating circuits employing means for compensating for changes in the system parameters are well known. In particular, such circuits have been adapted to provide the sweep generation voltage in cathode ray tubes employed in automobile ignition analysis apparatus. In such apparatus, it is common to have a cathode ray tube having a calibrated grid on the face thereof. The sweep across the face of the cathode ray tube displays one or more ignition pulses against the calibrated display. As the speed of revolution of the engine increases or decreases, the time interval between adjacent ignition pulses changes. Unless provision is made for changing the slope of the ramp function generator driving the sweep of the cathode ray tube, the sweep duration vis-a-vis the calibration markings on the face of the cathode ray tube will no longer be in synchronization. Accordingly, in the prior art, the time of occurrence of the ignition pulses is sensed along with the attaining of the end of the sweep voltage. Either continuous or momentary adjustments are applied to the ramp function generator in order to increase or decrease the slope in a manner which will achieve the desired sweep and ignition pulse coincidence. The problem in such apparatus is one of attaining a fairly rapid response with a relatively low degree of accuracy required. To accomplish these ends, the prior art employs a technique wherein a proportional adjustment is made to the slope of the ramp function generator. That is, the greater the deviation from coincidence between the occurrence of the spark pulse from the ignition and the end of the sweep, the greater the change applied to the slope. Likewise, a bidirectional adjustment is made wherein the slope of the ramp function generator is driven either up or down to compensate for sweeps which are taking too long as well as sweeps which are occurring too rapidly, respectively.

In certain applications, the time of response to changes is not critical, whereas the accuracy required is of paramount importance. In particular, in analog-to-digital conversion, digital voltmeter circuits, and other apparatus to be discussed in greater detail hereinafter, a high precision ramp function can be put to good advantage. In such circuits, the problem is one of component tolerance drift. As the circuit components age and are subjected to temperature extremes, etc., the calibration of the system may drift causing the required accuracy to be lost. Typically, such inaccuracies can develop over a period of minutes, or even hours, days and weeks. In the prior art discussed above, the proportional adjustments made to the slope of the ramp function being generated are made to compensate for changes in the time base of reference (spark plug firings) since component drift is considered negligible in the particular application. In the present case, however, only time, as represented by a clock frequency generator, can be counted on as being an accurate base from which to establish and compensate for variances in the system components. That is, in prior art applications the time base employed varied whereas, in the application of the present invention, the time base is substantially fixed.

Wherefore, it is the object of the present invention to provide an improved circuit for generating a precision ramp function wherein an oscillator is used to establish a time base which is then used as a known reference point from which to establish a correction factor to the slope of the generated ramp function to compensate for drift in the components of the circuit.

SUMMARY

The above objective has been achieved in the present invention by providing a clock pulse generator to divide the period of occurrence of the ramp function generated into a plurality of time divisions or clock periods N. If, at the end of N clock periods the ramp has attained the desired reference peak level, no change is applied to the slope. If, on the other hand, at the end of N clock periods the ramp function has not achieved the peak reference voltage, the slope is increased by applying a fixed correction factor for a limited period of time. In the preferred embodiment, the adjustment to increase the slope of the ramp generated is applied for a maximum of one clock period. The circuitry establishing the slope of the ramp function incorporates bleed means for forcing the slope to slowly drift in a negative direction. Thus, positive action of a corrective nature need only be taken in one direction.

DESCRIPTION OF THE DRAWINGS

FIG. 1 is a block diagram of the basic circuit of the present invention.

FIG. 2 is the top view of a gas discharge display panel used for a bar graph wherein the present invention is used to good advantage.

FIG. 3 is a partial cross section through the panel of FIG. 2.

DESCRIPTION OF THE PREFERRED EMBODIMENT

Figure 4:
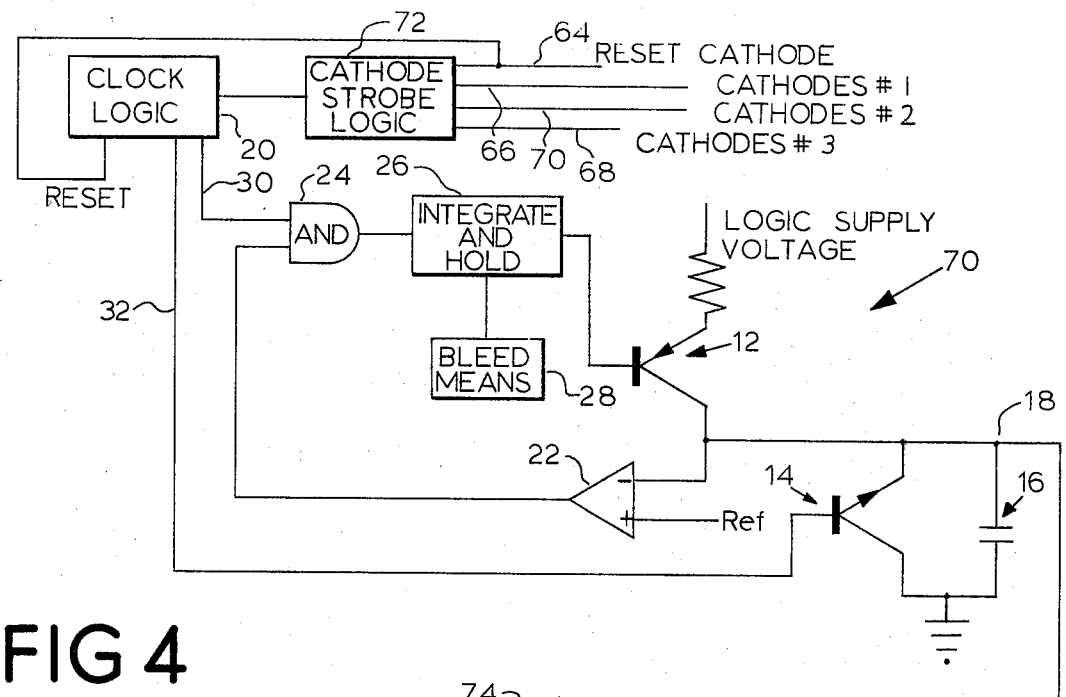
FIG. 4 is a block diagram of a bar graph driving circuit to be employed with the gas discharge display panel of FIG. 2 employing the ramp generator of the present invention.

Referring to FIG. 1, the present invention is shown in a circuit generally indicated at 10. A typical means for generating a ramp function is shown as comprising transistors 12 and 14 in conjunction with integrating capacitor 16. Transistor 12 is a current source and the amount of current flowing through transistor 12 is controlled by the voltage applied to the base thereof. The integrating capacitor 16 is connected to be charged by the current flowing through transistor 12. Thus, the slope of the ramp function generated at the terminal 18 marked "OUTPUT" is a function of the rate of current flow through transistor 12 which, in turn, is a function of the voltage applied at the base thereof. Transistor 14 is connected in parallel to integrating capacitor 16 whereby when transistor 14 is nonconductive, integrating capacitor 16 can charge to provide an increasing voltage or ramp function output at terminal 18. By making transistor 14 conductive, capacitor 16 can be shorted and discharged thereby resetting the ramp function output to zero. The portion of the present invention comprising transistors 12 and 14 in combination with integrating capacitor 16 is well known in the art and can be replaced by any other means for generating a ramp function having an input determinative of the slope of the ramp function output and an input for resetting the ramp function to zero. For purposes of the present invention, circuit 10 is provided with clock logic 20 providing a series of clock pulses and including appropriate counting logic for fixing N, the number of clock periods or pulses during which the ramp attains its full value. It is the object of the present invention that the ramp function appearing at output terminal 18 achieve a desired reference voltage in a fixed time period. The time period is fixed by clock logic 20 and the reference voltage is provided as one input to a comparator 22. The other input to comparator 22 is connected to the ramp function voltage appearing at output 18. The output of comparator 22 is true whenever the reference voltage is greater than the value of the ramp function voltage and goes to false when the ramp function voltage is equal to or greater than the reference voltage. The output of comparator 22 is connected as one input of AND gate 24. The second input of AND gate 24 is provided by a connection to clock logic 20. The output of AND gate 24 is connected to the input of an integrate and hold circuit 26. The output of integrate and hold circuit 26 is connected to the base of transistor 12 and by controlling the current into the integrating capacitor 16 it determines the slope of the ramp function being generated. Bleed means 28 are connected to integrate and hold circuit 26 whereby, contrary to the typical integrate and hold circuit, the output value of integrate and hold circuit 26 is not maintained for an indefinite period but rather, will drop at a preselected rate by virtue of the action of bleed means 28. Specific circuitry for accomplishing an integrate and hold function with bleed means has been successfully accomplished very simply with a diode, two resistors, and a capacitor (provided AND gate 24 is replaced with a NAND gate), or alternatively, the integrate and hold function can be accomplished by having an operational amplifier with a capacitor in the feedback loop to provide the integrator and having a high resistance value in parallel with the capacitor to provide the bleed function. Such techniques are well known to persons skilled in the art and form no part of the present invention. A connection 32 is also provided from clock logic 20 to the base of transistor 14 for allowing the ramp function appearing at output 18 to be reset under the control of clock logic 20. In operation, clock logic 20 first resets the ramp function output at output terminal 18 by a reset signal making transistor 14 conductive through connection 32. A particularly effective technique for completely discharging capacitor 16 is to connect transistor 14 with the base and the emitter connected in reverse as shown in FIG. 1. When integrating capacitor 16 has been completely discharged by transistor 14, clock logic 20 makes transistor 14 nonconductive through connection 32 by removing the reset signal to begin the ramp function generation. Transistor 12 thereupon conducts at a rate as established by the output of integrate and hold circuit 26 connected to the base of transistor 12. Clock logic 20 allows integrating capacitor 16 to charge through transistor 12 for the number of clock pulses N which have been predefined as the ramp period. At the end of N clock periods, connection 30 is made true as a drift compensation signal for, preferably, one clock period. If the output of comparator 22 is also true, signifying that the ramp function output at terminal 18 has not yet reached the reference voltage, the output of AND gate 24 connected to the integrate and hold circuit 26 will be true for up to the one clock period when connection 30 is true. This will cause a single fixed level pulse compensation increase to the value of integrate and hold circuit 26 which, by a corresponding change in the output thereof, will increase the conduction through transistor 12 and, thereby, increase the slope of the ramp function output. The single adjustment having occurred, if necessary, during the length of the single clock pulse N+1, at clock pulse N+2 connection 30 is turned false and connection 32 is made true to again reset the ramp function to zero. The process then repeats itself once again at the new slope. If, at the end of the next N clock pulses, the ramp function output has once again not attained the reference voltage appearing at the input of comparator 22, another compensation step increase in the value of integrate and hold circuit 26 will be applied during the N+1 clock pulse by AND gate 24. This fixed increase in the slope value will be applied until such time as the ramp function output is equal to the reference value appearing at comparator 22 during some portion of clock pulse N+1. Once a state of equilibrium has been achieved, clock logic 20 is adapted to cause compensation to be applied only for a function of the N+1 clock pulse in an amount just large enough to replace the charge removed by bleed means 28 during the last N clock pulses. This balance is maintained until a large change causes the need for full compensation to be applied once again. A slight component drift causes a responding slight change in the time duration of compensation during the N+1 clock period.

Because compensation is only applied in a positive direction, bleed means 28 must be sized to cause the value of the output of integrate and hold circuit 26, determining the slope of the ramp function output, to decrease at a rate which is equal to or greater than the maximum effect of component drift which can be expected to cause an increase in the slope of the ramp function. That is, if it is possible for component drift to increase the slope at a rate which is greater than bleed means 28 is causing a decrease in the slope of the ramp function output, circuit 10 will not be able to compensate for such component drift. Very satisfactory results have been attained in embodiments to be hereinafter described wherein the ramp period is 200 clock pulses and compensation is applied for one clock pulse. During component drift resulting in slope increase, the slope increase from the component drift will be offset by the effect of bleed means 28 thereby resulting in a decrease in the rate of offset compensation application. During component drift in the negative slope direction, the effect of component drift and bleed means 28 will be combined resulting in the application of compensation for a longer time during the N+1 clock pulse. It should be noted that while in the preferred embodiment as described the compensation is applied for some or all of the N+1 clock pulse, the compensation could be applied during any portion of the ramp, for example, at the center of the ramp. In that case, the ramp would reach its reference value at N/2 clock pulses and twice the reference value at N pulses.

The ramp function circuit of FIG. 1 is particularly well suited for use with a bar graph gas discharge display panel as shown in FIG. 2 and FIG. 3. In gas discharge display apparatus such as that generally indicated as 50, a glass substrate 52 has cathode elements 54 affixed thereto. A transparent cover 56 is provided in spaced relationship and having a transparent anode material 58 affixed on the surface adjacent cathodes 54. Substrate 52 and cover 56 are sealed in such spaced relationship around the periphery thereof to form an enclosure 60 therebetween containing an ionizable gas 62 such as neon. By applying an electrical potential between a cathode 54 and the anode 58, the ionizable gas 62 can be caused to ionize and, thereby, glow in the region between the particular cathode element 54 and the anode 58. It has been found that a potential can be applied between a cathode 54 and the anode 58 wherein, if a previously ionized gas 62 is in the region between one of the next adjacent cathodes 54 and the anode 58, the potential will be sufficient to ionize the gas 62 more quickly in the presence of the previously ionized gas 62.

This phenomenon can be put to good advantage in a gas discharge display 50 as shown in FIG. 2. A plurality of cathodes 54 are affixed to the substrate 52 in parallel spaced relationship. The lowest cathode element 54 is connected individually to an electrical connection 64 connectable to a source of power (not shown) capable of ionizing the ionizable gas in the absence of previously ionized gas. The next adjacent cathode element 54 and every third cathode element 54 thereafter are connected in common to an electrical connection 66 connectable to a source of power capable of ionizing the gas 62 more quickly in the presence of a previously ionized layer of gas 62 at a next adjacent cathode element 54 as described above. In like manner, the next cathode element 54 and every third cathode element 54 thereafter is connected to an electrical connection 68 and the next cathode element 54 and every third cathode element 54 thereafter is connected to an electrical connection 70. Electrical connections 68 and 70 are also adapted to be connected to a source of power which can ionize gas 62 more quickly in the presence of a previously ionized layer of gas 62 at a next adjacent cathode element 54. In such apparatus, a gas discharge glow can be made to move up or down the cathode elements 54 in a strobing fashion. This is accomplished by first applying a potential to line 64 to ionize the gas 62 adjacent the bottom cathode element 54. Potential is next applied to line 66 which causes a potential to exist between all cathodes 54 connected to line 66 and anode 58. Since, however, the potential applied thereto is chosen to ionize gas 62 more quickly in the presence of a previously ionized layer at a next adjacent cathode element 54, the gas adjacent the second cathode element 54 will be caused to ionize first because of the previously ionized layer adjacent the bottom cathode element 54. It is characteristic of such apparatus that once the gas adjacent an element has ionized, the remaining elements of the group cannot ionize gas adjacent thereto. Gas 62 adjacent the second cathode element 54 having been ionized, the potential can be removed from line 64. By then applying a potential to line 70, and thereafter removing the potential from line 66, the gas discharge can be made to move from the second cathode element 54 to the third cathode element 54 in the same manner. By alternately applying potential next to line 68 then line 66 followed by line 70 once again seriatim, the gas discharge can be made to "walk" from the bottom to the top of the gas discharge display 50. As will be apparent, by correctly modifying the sequence of applying the potential to lines 66, 68, and 70, the gas discharge also can be made to move down the apparatus 50.

The apparatus 50 as shown in FIG. 2 is adapted to be used as a bar graph. The entire plurality of cathode elements 54 from the bottom to the top represent 100% and, for convenience, a scale 72 can be affixed to substrate 52 for comparison by an observer. In use, the bar graph can be strobed by causing the gas discharge to move from the bottom to the top. As with the cyclic illumination of alternating current lamps or projected motion pictures, if the strobing occurs at a rate which is faster than the persistence of the observer's eye, he will perceive the light as a continuous bar. If the gas discharge is made to ionize the gas over only a portion of the length of scale 72, the bar of light seen by the observer will exist only over the same corresponding portion of the scale 72. If the portion of the cathode elements 54 having a gas discharge and the portion not having a gas discharge can be controlled, the bar of light can be made to move up and down the scale 72 in the manner of the mercury in a thermometer. If, additionally, the movement of the light against the scale 72 can be done accurately in conjunction with an analog input value, the apparatus 50 can be used as an illuminated bar graph. Such is the desired objective.

A driver for such a gas discharge bar graph display 50 employing the present invention is shown in FIG. 4. In the driver generally indicated as 70 of FIG. 4, elements in common with the circuit of FIG. 1 are labeled with like numerical indication. Cathode strobe logic 72 has its input connected to clock logic 70 so as to be responsive to the clock pulses thereof. The outputs 64, 66, 68 and 70 of cathode strobe logic 72 are connected to the corresponding cathode connections on the gas discharge bar graph display 50 of FIG. 2. Additionally, a connection is made from reset line 64 which initially starts the strobing of the bar graph display 50 at the bottom cathode element 54 to the counter logic reset input of clock logic 20. Cathode strobe logic 72 causes the strobing potential to be applied to the cathodes 54 of bar graph display 50. The potential to the anode 58 of bar graph display 50 is provided by connection to the output of a second comparator 74. One input of comparator 74 is connected to terminal 18 which is the output ramp function. The second input to comparator 74 is connected to the analog voltage of interest to be displayed on the bar graph display 50. In this manner the bar graph display 50 will be driven by the driver 70 in a truly accurate proportional manner once initial calibration has been made.

There are two variables present in the driver 70 of FIG. 4. The first is the reference voltage input to comparator 22 and the second is the analog voltage input to comparator 74. The reference voltage determines the 100% point of comparison in comparator 74 since the ramp function output will be compensated until its peak value as compared to the reference voltage in comparator 22 is equal. Thus, the analog input to comparator 74 will be compared against the reference voltage. By setting the reference voltage so that the ramp function generated is equal to the reference voltage precisely when the strobe of the bar graph display reaches the top, the bar graph will be caused to display the analog input value to comparator 74 proportionally on the bar graph display 50. Comparator 74 has its output which is connected to the anode 58 of display 50 in a true state, or on, whenever the analog input is greater than the value of the ramp function appearing at terminal 18. Thus, as the bar graph display 15 is being strobed from the bottom to the top in synchronization with the ramp function output increase from zero to its maximum value, the anode will be charged causing a glow during that portion of the strobe when the ramp is less than the analog value. When the ramp and, therefore, the strobe have reached the position where the ramp is equal to the analog input, the anode 58 will no longer be charged and the gas discharge or glow will be suppressed for the balance of the strobe. Thus, the portion of the strobed bar graph display 50 proportionally equal to the analog input over the reference voltage will be illuminated for comparison against the scale 72.

Figure 5:
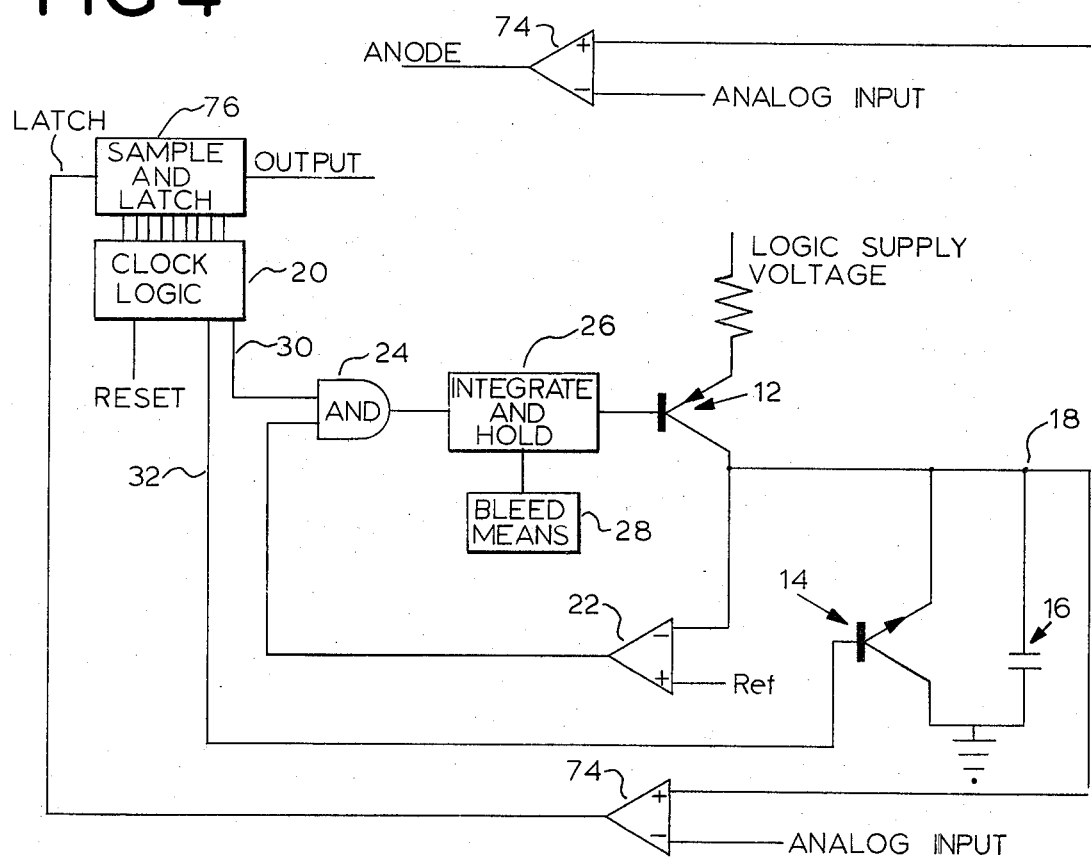
FIG. 5 is a block diagram of an analog-to-digital converter employing the circuit of the present invention.

Referring now to FIG. 5, additional logic is shown which can be used individually or in combination with the strobing logic of FIG. 4. The objective of the additional circuitry added in FIG. 5 is to provide an analog-to-digital conversion capability. In the apparatus of FIG. 5, sample and latch means 76 have been connected with their inputs to clock logic 20 whereby the instantaneous digital count contained within the clock logic 20 in counting from zero to N can be sampled. The output of comparator 74 is connected to the latch input of sample and latch means 76 whereby sample and latch means 76 will track the value of clock logic 20 until the point when the ramp function is equal to the analog input. At that time, sample and latch means 76 will be latched to hold the value attained at that point. The digital output when appearing at the output of sample and latch means 76 can be sampled by any device, such as a computer or the like, to determine the analog value being input at comparator 74.

The apparatus of FIG. 5 is particularly well suited for incorporation into digital voltmeters presently incorporating dual slope proportioning circuits. By incorporating the precision self adjusting ramp logic of the present invention in the manner shown in FIG. 5, highly precise digital voltmeters can be fabricated employing far simpler circuitry. The self adjusting slope method, like the dual slope method, has the advantages of completely cancelling errors due to clock frequency changes, component drift and the like as well as being a ratio device in the sense that the actual digital output divided by the full scale digital output is equal to the actual analog input voltage divided by the reference voltage.

Having thus described my invention, I claim:

1. An improved drift correcting ramp voltage generator circuit comprising:
   (a) circuit means for generating a ramp voltage output having an input for resetting the ramp voltage to a starting value and an input for determining the slope of the ramp voltage;
   (b) a comparator having a pair of inputs and an output, one of said pair of inputs being connected to said ramp voltage output, the other of said pair of inputs being connected to a reference voltage source;
   (c) an integrate and hold circuit having an input and an output, said output being connected to said ramp slope determining input;
   (d) bleed means connected to said integrate and hold circuit for continuously bleeding off the value being held at a predetermined rate to cause the output from said integrate and hold circuit coupled to said ramp slope determining input to drift in one direction;
   (e) a clock logic circuit having a pair of outputs, means for producing a plurality of pulses and counting means responsive to said pulses for generating an output signal on one of said outputs when the ramp is to be reset and an output signal coincident with a preselected one of said pulses on the other of said outputs when drift compensation is to be applied, said reset signal output being connected to said resetting input of said ramp generating circuit; and,
   (f) a gate circuit having a pair of inputs and an output, one of said inputs being connected to said drift compensation signal output of said clock logic circuit, the other of said inputs being connected to said output of said comparator, said gate circuit output being connected to said input of said integrate and hold circuit, said gate circuit applying a fixed compensation value to the value held by said integrate and hold circuit while said pair of gate circuit inputs receive signals in coincidence to cause the output from said integrate and hold circuit coupled to said ramp slope determining input to change in a direction opposite to said one direction.

2. The improved ramp generator claimed in claim 1 and additionally including:
   (a) means for sampling and latching a binary value connected to said counting means of said clock logic circuit, said sampling and latching means having an input for causing said latching means to latch at the binary value connected thereto and an output for reading the latched value; and,
   (b) a second comparator having a pair of inputs and an output, said output being connected to said latching means input, one of said inputs being connected to said ramp voltage output, the other of said inputs being connectable to an analog value signal whereby said sampling and latching means will latch at a binary value related to said analog value.

3. An improved circuit for generating a precision ramp voltage of the type comprising:
   a ramp generator having an input for resetting the ramp to an initial value, an input for determining the slope of the ramp, and a ramp output;
   an integrate and hold circuit having an input and an output, the latter output connected to the slope determination input of the ramp generator; and,
   means for comparing the ramp voltage to a reference voltage level to be attained by the ramp voltage having a pair of inputs connected to a reference voltage source and the ramp generator output, respectively, and an output, the output indicating by change of signal state the occurrence of the ramp voltage attaining the level of the reference voltage;
   the improvement comprising:
   (a) means for bleeding off the value being held by the integrate and hold circuit operably connected to the integrate and hold circuit whereby the slope of the ramp function will constantly be subject to a change in one direction;
   (b) means for producing a plurality of clock pulses;
   (c) means connected to said clock pulse producing means and responsive to said clock pulses for counting said clock pulses to establish a time base for the ramp voltage, said counting means having a first output connected to the resetting input of the ramp generator and producing a reset signal on said first output in coincidence with one of said clock pulses to reset the ramp voltage and start a period of N clock pulses in which the ramp voltage is to attain a value related to the reference voltage, said counting means having a second output and producing a drift compensation signal on said second output in coincidence with and for the duration of another one of said clock pulses; and (d) a gate circuit having a pair of inputs and an output, one of said inputs being connected to said second output of said counting means, the other of said inputs being connected to the output of the comparing means, said gate circuit output being connected to the input of the integrate and hold circuit, said gate circuit being adapted to apply a fixed compensation voltage to said integrate and hold circuit while said drift compensation signal and comparing means output signal are in coincidence.

4. The improved circuit of claim 3 wherein:
said bleed means is adapted to bleed off the value being held by the integrate and hold means at a rate which will cause the slope of the ramp to tend to change in one direction an amount at least equal to the maximum amount component drift will tend to cause the slope of the ramp to change in the opposite direction.

5. In a precision ramp generator including an integrate and hold circuit the output of which determines the slope of the ramp, the method of compensating for component drift comprising the steps of:

(a) bleeding off a portion of the value being held by the integrate and hold circuit to cause the slope of the ramp to drift in one direction;

(b) comparing the value of the ramp to a reference value the ramp should reach at a fixed time at that fixed time;

(c) enabling a path for applying a compensation value to the integrate and hold circuit for a fixed time duration; and (d) applying a fixed compensation value to the integrate and hold circuit to cause the slope of the ramp to change in a direction opposite that associated with bleeding step (a) for that portion of the fixed time duration of step (c) wherein the ramp has not attained the reference value.

6. A method of compensating for the drift of an electrical signal from a predetermined signal value where the signal is subject to such drift in a first direction comprising the steps of:

(a) causing the value of the electrical signal to continuously change (1) in a second direction opposite to the first direction of drift and (2) in an amount at least equal to the maximum amount of the signal drift in the first direction; and (b) correctively varying the value of the electrical signal incrementally, as required, in the first direction of drift to restore the signal to the predetermined value thereby enabling the signal drift to be compensated by corrective variations of the electrical signal taken in only one direction.

* * * * *